United States Patent [19]

Takagi

[11] Patent Number: 5,715,266
[45] Date of Patent: Feb. 3, 1998

[54] SEMICONDUCTOR LASER

[75] Inventor: Kazuhisa Takagi, Tokyo, Japan

[73] Assignee: Mitsubishi Denki Kabushiki Kaisha, Tokyo, Japan

[21] Appl. No.: 600,252

[22] Filed: Feb. 12, 1996

[30] Foreign Application Priority Data

Sep. 4, 1995 [JP] Japan ................ 7-226125

[51] Int. Cl.$^6$ ................ H01S 3/19
[52] U.S. Cl. ................ 372/45; 372/50
[58] Field of Search ................ 372/50, 45

[56] References Cited

U.S. PATENT DOCUMENTS 5,212,706  5/1993  Jain ................ 372/45
5,365,536  11/1994  Seki ................ 372/45

FOREIGN PATENT DOCUMENTS 690063  3/1994  Japan .

OTHER PUBLICATIONS

Casey, Jr. et al, Heterostructure Lasers Part A: Fundamental Principles, New York: Academic Press, Inc, 1978 (no month available), pp. 44–45.

Casey, Jr. et al, Heterostructure Lasers Part B: Materials and Operating Characteristics, New York: Academic Press, Inc, 1978 (no month available), pp. 12–13.

*Primary Examiner*—Brian Healy
*Assistant Examiner*—Luong-Quyen T. Phan
*Attorney, Agent, or Firm*—Leydig, Voit & Mayer, Ltd.

[57] ABSTRACT

A semiconductor laser comprises a first laser structure, a tunnel diode structure, and a second laser structure which are successively formed so that the forward directions of the first laser structure and the second laser structure are the same as the forward direction of the semiconductor laser, and the forward direction of the tunnel diode structure is reverse to the forward direction of the semiconductor laser, wherein laser beams are generated when a current flows in the forward direction, and an optical waveguide layer having a larger refractive index than the refractive indices of the first laser structure and the second laser structure and provided between the second laser structure and the tunnel diode structure or between the first laser structure and the tunnel diode structure. Therefore, even though the first laser structure 14 and the second laser structure 16 are formed at a long distance, the laser beam at the light emitting surface is made a single peak in shape, thereby increasing the output power of the laser.

6 Claims, 11 Drawing Sheets

SEMICONDUCTOR LASER

FIELD OF THE INVENTION

The present invention relates to an improvement in performance of a high output power semiconductor laser having two laser structures and a tunnel diode structure between these two laser structures.

BACKGROUND OF THE INVENTION

In order to increase the output power of a semiconductor laser, semiconductor lasers having various structures have been developed. As an example, a semiconductor device including two laser structures is disclosed in Japanese Published Patent Application Hei. 6-90063. In this semiconductor laser, a first laser structure, a tunnel diode structure, and a second laser structure are successively formed, the forward directions of the first laser structure and the second laser structure are the same as the forward direction of the semiconductor laser, and the forward direction of the tunnel diode structure is reverse to the forward direction of the semiconductor laser. As a result, a semiconductor laser having two laser structures with an improved yield and a reduced power consumption is obtained. This semiconductor laser will be described.

FIG. 18 is a perspective view illustrating the prior art semiconductor laser. In FIG. 18, reference numeral 101 designates an n type semiconductor substrate, numeral 102 designates a cladding layer comprising an n type semiconductor (hereinafter referred to as an n type cladding layer), numeral 103 designates a first active layer, and numeral 104 designates a cladding layer comprising a p type semiconductor (hereinafter referred to as a p type cladding layer). A first laser structure 112 is formed by the n type cladding layer 102, the first active layer 103, and the p type cladding layer 104. Reference numeral 105 designates a p$^+$ type high dopant concentration layer and numeral 106 designates an n$^+$ type high dopant concentration layer. A tunnel diode structure 113 is formed by a p$^+$n$^+$ junction of the p$^+$ type high dopant concentration layer 105 and the n$^+$ type high dopant concentration layer 106. Reference numeral 107 designates a cladding layer comprising an n type semiconductor (hereinafter referred to as an n type cladding layer), numeral 108 designates a second active layer, and numeral 109 designates a cladding layer comprising a p type semiconductor (hereinafter referred to as a p type cladding layer). A second laser structure 114 is formed by the n type cladding layer 107, the second active layer 108, and the p type cladding layer 109. Reference numeral 110 designates an insulating film for concentrating current and numeral 111 designates a surface electrode.

Heat is generated when a laser oscillates and, in order to increase the output power of the laser, it is required to prevent the laser from being affected by heat. Accordingly, in the prior art semiconductor laser having the first laser structure and the second laser structure, a space of about 10 μm must be provided between the two laser structures. However, when the first and the second laser structures are 10 μm apart, the problem described below arises.

FIG. 19 is a diagram illustrating a profile of the refractive index in a vertical cross-section of the prior art semiconductor laser structure shown in FIG. 18. The cladding layers 104 and 109 comprise p type InP having a refractive index $n_3$ of 3.18. The cladding layers 102 and 107 comprise n type InP. The first active layer 103 and the second active layer 108 comprise InGaAsP having a refractive index $n_1$ of 3.3 and thicknesses $d_1$ and $d_2$ of 0.2 μm, the high dopant concentration layers 105 and 106 respectively comprise p$^+$ type InP and n$^+$ type InP, and the interval $l_3$ between the first active layer 103 and the second active layer 108 is 10 μm. FIG. 20 shows a calculated near-field pattern of the light at the emitting surface for an oscillation wavelength $\lambda_3$ of 1.55 μm. This near-field pattern is obtained by calculating the electric field distribution at the wavelength of the laser structure using a one-dimensional Maxwell equation on the basis of the refractive index profile. As is apparent from FIG. 20, when the interval $l_3$ between the first laser structure 112 and the second laser structure 114 is 10 μm, the respective laser structures oscillate with modes that are independent of each other, and the near-field pattern at the light emitting surface is divided into two. Accordingly, by collimating the two divided near-field patterns, two parallel beams are produced. The two beams broaden so that the light beam intensity of the semiconductor laser having two laser structures is not larger than the density of a semiconductor laser having only one laser structure.

SUMMARY OF THE INVENTION

It is an object of the present invention to provide a semiconductor laser having a first laser structure and a second laser structure that produce, as a near-field pattern at the light emitting surface, a beam with a single peak even when the spacing between the respective laser structures is sufficiently large to prevent each laser structure from being affected by heat from the other laser structures.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser comprises a first laser structure, a tunnel diode structure, and a second laser structure, successively formed so that the forward directions of the first laser structure and the second laser structure are the same as the forward direction of the semiconductor laser, and the forward direction of the tunnel diode structure is reverse to the forward direction of the semiconductor laser, wherein laser light is generated when a current flows in the forward direction, and including an optical waveguide having a larger refractive index than the refractive indices of the first laser structure and the second laser structure and located between the second laser structure and the tunnel diode structure or between the first laser structure and the tunnel diode structure. Therefore, even though the first laser structure and the second laser structure are separated by a long distance, the laser beam at the light emitting surface has a single peak, increasing the output power of the laser.

According to a second aspect of the present invention, in the semiconductor laser, the first laser structure and the second laser structure both comprise an active layer comprising InGaAsP and a cladding layer comprising InP, and the optical waveguide layer comprises Si. According to a third aspect of the present invention, in the semiconductor laser, the first laser structure and the second laser structure both comprise an active layer comprising InGaAs$_{y1}$P$_{1-y1}$ and a cladding layer comprising InP and the optical waveguide layer comprises InGaAs$_{y2}$P$_{1-y1}$ lattice matching with InP of the cladding layer. The composition ratios of As in the first laser structure, the second laser structure, and the optical waveguide are in a relation of y2>y1.

According to a fourth aspect of the present invention, in the semiconductor laser, the first laser structure and the second laser structure both comprise an active layer comprising $Al_{x1}Ga_{1-x1}As$ and a cladding layer comprising $Al_{x2}Ga_{1-x2}As$ and the optical waveguide comprises $Al_{x3}Ga_{1-x3}As$ or GaAs. The composition ratios of Al in the first laser structure, the second laser structure, the cladding layer, and the optical waveguide are in a relation of $x_3 < x_1 < x_2$.

According to a fifth aspect of the present invention, in the semiconductor laser, the first laser structure and the second laser structure both comprise an active layer comprising $Al_{x1}Ga_{1-x1-y1}In_{y1}As$ and a cladding layer comprising $Al_{x2}Ga_{1-x2-y2}In_{y2}As$ and the optical waveguide layer comprises $Al_{x3}Ga_{1-x3-y3}In_{y3}As$. The composition ratios of Al and In in the respective layers, (x1, y1), (x2, y2), (x3, y3) are in relations of:

$$0.73(x2 - x1) + 1.27(y2 - y1) > 0$$
$$0.73(x1 - x3) + 1.27(y1 - y3) > 0$$
$$-1.25(x1 - x3) + 2.47(y1 - y3) > 0$$
$$-1.25(x1 - x2) + 2.47(y1 - y2) > 0.$$

According to a sixth aspect of the present invention, a semiconductor laser comprises a first laser structure, a tunnel diode structure, and a second laser structure which are successively formed so that the forward directions of the first laser structure and the second laser structure are the same as the forward direction of the semiconductor laser, and the forward direction of the tunnel diode structure is reverse to the forward direction of the semiconductor laser, wherein laser light is generated when a current flows in the forward direction, and the tunnel diode structure comprises a semiconductor having a larger refractive index than the refractive indices of the first laser structure and the second laser structure. Therefore, even though the number of the grown crystalline layers is the same as that of the prior art semiconductor laser and the first laser structure and the second laser structure are separated by a long distance, the laser beam at the light emitting surface has a single peak, increasing the output power of the laser.

According to a seventh aspect of the present invention, in the semiconductor laser, the first laser structure and the second laser structure both comprise an active layer comprising InGaAsP and a cladding layer comprising InP and the tunnel diode structure comprises Si.

According to an eighth aspect of the present invention, in the semiconductor laser, the first laser structure and the second laser structure both comprise an active layer comprising $InGaAs_{y1}P_{1-y1}$ and a cladding layer comprising InP and the tunnel diode structure comprises $InGaAs_{y2}P_{1-y1}$ lattice matching with InP of the cladding layer. The composition ratios of As in the first laser structure, the second laser structure, and the optical waveguide are in a relation of y2>y1.

According to a ninth aspect of the present invention, in the semiconductor laser, the first laser structure and the second laser structure both comprise an active layer comprising $Al_{x1}Ga_{1-x1}As$ and a cladding layer comprising $Al_{x2}Ga_{1-x2}As$ and the tunnel diode structure comprises $Al_{x3}Ga_{1-x3}As$ or GaAs. The composition ratios of Al in the first laser structure, the second laser structure, the cladding layer, and the optical waveguide are in a relation of $x_3 < x_1 < x_2$.

According to a tenth aspect of the present invention, in the above-described semiconductor laser, the first laser structure and the second laser structure both comprise an active layer comprising $Al_{x1}Ga_{1-x1-y1}In_{y1}As$ and a cladding layer comprising $Al_{x2}Ga_{1-x2-y2}In_{y2}As$ and the tunnel diode structure comprises $Al_{x3}Ga_{1-x3-y3}In_{y3}As$. The composition ratios of Al and In in the respective layers, (x1, y1), (x2, y2), (x3, y3) are in relations of:

$$0.73(x2 - x1) + 1.27(y2 - y1) > 0$$
$$0.73(x1 - x3) + 1.27(y1 - y3) > 0$$
$$-1.25(x1 - x3) + 2.47(y1 - y3) > 0$$
$$-1.25(x1 - x2) + 2.47(y1 - y2) > 0.$$

DETAILED DESCRIPTION OF THE PREFERRED EMBODIMENTS

Embodiment 1

A semiconductor laser according to a first embodiment of the present invention includes a first laser structure 14, a tunnel diode structure 15, and a second laser structure 16 which are successively formed. The forward directions of the first laser structure 14 and the second laser structure 16 are the same as the forward direction of the semiconductor laser, and the forward direction of the tunnel diode structure 15 is reverse to the forward direction of the semiconductor laser. In the semiconductor laser in which laser beams are generated when a current flows in the forward direction, an optical waveguide layer 8 having a refractive index larger than the refractive indices of the first laser structure 14 and the second laser structure 16 is disposed between the second laser structure 16 and the tunnel diode structure 15. Therefore, even though the first laser structure 14 and the second laser structure 16 are widely separated, the laser beam at the light emitting surface has a single peak, increasing the output power of the laser.

Figure 2:
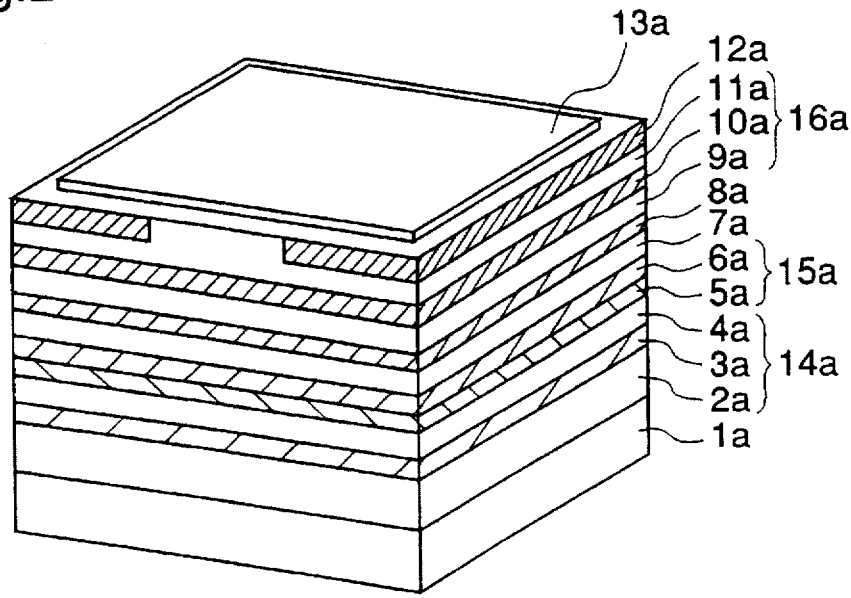
FIG. 2 is a perspective view illustrating a semiconductor laser according to a first example of the first embodiment of the present invention.

FIG. 2 is a perspective view illustrating a semiconductor laser according to a first example of the first embodiment of the invention. In FIG. 2, reference numeral 1a designates an n type InP semiconductor substrate. An n type InP cladding layer 2a having a prescribed thickness is disposed on the n type InP semiconductor substrate 1a. An InGaAsP first active layer 3a having a thickness of 0.2 μm is disposed on the n type InP cladding layer 2a. A p type InP cladding layer 4a having a thickness of 3.6 μm is disposed on the first active layer 3a. A first laser structure 14a is formed by the n type InP cladding layer 2a, the first active layer 3a, and the p type InP cladding layer 4a. A p$^+$ type InP layer 5a doped with a dopant impurity to a high concentration and having a thickness of 0.2 μm is disposed on the p type InP cladding layer 4a. An n$^+$ type InP layer 6a doped with a dopant impurity to a high concentration and having a thickness of 0.2 μm is disposed on the p$^+$ type InP layer 5a. A tunnel diode structure 15a is formed by the p$^+$n$^+$ junction of the p$^+$ type InP layer 5a and the n$^+$ type InP layer 6a. In addition, an n type InP cladding layer 7a having a thickness of 1 μm is disposed on the tunnel diode structure 15a. An Si optical waveguide layer 8a is disposed on the n type InP cladding layer 7a. An n type InP cladding layer 9a having a thickness of 5 μm is disposed on the optical waveguide layer 8a, an InGaAsP second active layer 10a having a thickness of 0.2 μm is disposed on the n type InP cladding layer 9a, and a p type InP cladding layer 11a having a prescribed thickness is disposed on the second active layer 10a. A second laser structure 16a is formed by the n type InP cladding layer 9a, the second active layer 10a, and the p type InP cladding layer 11a. Reference numeral 12a designates an SiO$_2$ insulating film disposed on the p type InP cladding layer 11a for concentrating current flow, and numeral 13a designates an Au surface electrode having a thickness of 4 μm and disposed on the insulating film 12a.

The semiconductor laser according to the first example is fundamentally identical to the semiconductor laser according to the first embodiment of the invention except that the first laser structure and the second laser structure both comprise an InGaAsP active layer and InP cladding layers and the optical waveguide layer comprises Si.

It is confirmed that, in the semiconductor laser according to the first example, the laser beams generated from the first laser structure 14a and the second laser structure 16a are guided to the optical waveguide 8a having a large refractive index, and the near-field pattern at the light emitting surface has a single peak.

Figure 3:
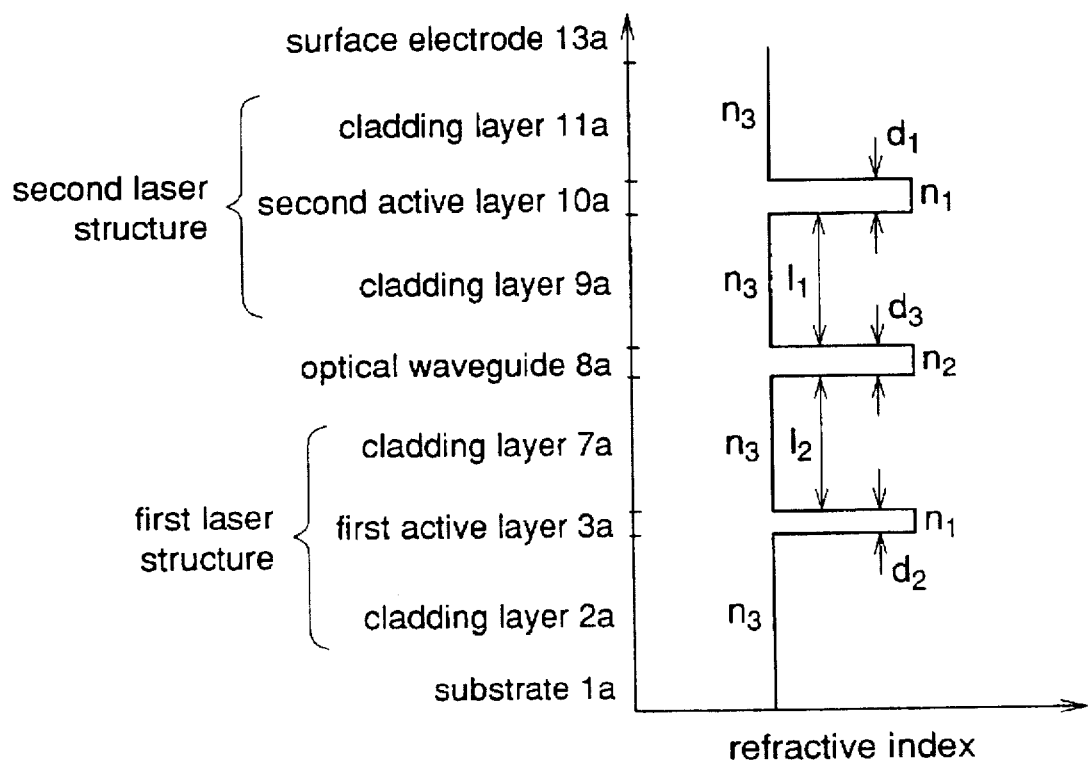
FIG. 3 is a diagram showing a profile of the refractive index in a vertical cross-section of the semiconductor laser according to the first example of the first embodiment.

FIG. 3 is a diagram illustrating a profile of the refractive index in a vertical cross-section of the semiconductor laser according to the first example in the first embodiment. In FIG. 3, $n_1$ indicates the refractive index of InGaAsP ($n_1$=3.3), $n_2$ indicates the refractive index of Si ($n_2$=3.45), and $n_3$ indicates the refractive index of InP ($n_3$=3.18), $d_1$ indicates the thickness of the first active layer 3a ($d_1$=0.2 μm), $d_2$ indicates the thickness of the second active layer 10a ($d_2$=0.2 μm), $d_3$ indicates the thickness of the optical waveguide 8a ($d_1$=0.08 μm), $l_1$ indicates the thickness of the n type InP cladding layer 9a ($l_1$=5 μm), and $l_2$ indicates the thickness of the p type InP cladding layer 4a ($l_2$=5 μm).

The confirmation of near-field pattern is obtained by calculating the electric field distribution at the oscillation wavelength λ of the first laser structure 14a and the second laser structure 16a by solving the one-dimensional Maxwell equation using the profile of the refractive index. The near-field pattern has a maximum value at the optical waveguide 8a and a value other than 0 in the laser structures. If the near-field pattern has such a value, a transmission mode is generated between the first laser structure 14a and the optical waveguide Ba and between the second laser structure 16a and the optical waveguide 8a. The laser beams generated in the first and the second laser structures 14a and 16a are guided to the optical waveguide 8a and the near-field pattern of the light emitting surface has a single peak.

The Maxwell equation for obtaining the near-field pattern is represented by $$[\nabla^2 + \{n^2(x,y,z) \cdot k_0^2\}] \cdot \phi(x,y,z) = 0 \tag{1}$$

$$\nabla^2 = \frac{d^2}{dx^2} + \frac{d^2}{dy^2} + \frac{d^2}{dz^2}$$

where x is the laminating direction of the semiconductor layers, y is resonator width direction, z is resonator length direction, ø is the potential of an electromagnetic wave, n is refractive index as a function of position, and $k_0$ is the wave number in a vacuum. Since $\phi(x,y,z) = \phi_x(x) \cdot \phi_y(y) \cdot \phi_z(z)$, equation (1) can be modified to $$\frac{d^2\phi_x}{dx^2} - \gamma_x^2(x) = 0 \tag{2}$$

$$\frac{d^2\phi_y}{dy^2} - \gamma_y^2(y) = 0 \tag{3}$$

$$\frac{d^2\phi_z}{dz^2} - \gamma_z^2(z) = 0 \tag{4}$$

$$\gamma_x^2(x) + \gamma_y^2(y) + \gamma_z^2(z) + n^2(x,y,z) \cdot k_0^2 = 0 \tag{5}$$

Since the semiconductor laser according to the first example is applied to a transverse oscillation mode, the following equation (6) is obtained.

$$\gamma_i^2(y) = 0, \quad \frac{d\phi_y}{dy} = 0, \quad \frac{d^2\phi_z}{dz^2} = 0 \qquad (6)$$

By substituting this equation (6) in equations (2), (3), (4), and (5), the potential of the electromagnetic wave in each layer is represented by first layer: $\phi_{x1} = B_{1,1} \cdot \exp(\gamma_{x1} \cdot x)$ (7)

second layer: $\phi_{x2} = B_{2,1} \cdot \exp(-\gamma_{x2} \cdot x) + B_{2,2} \cdot \exp(\gamma_{x2} \cdot x)$

. . .
. . .
. . .

$i$-th layer: $\phi_{xi} = B_{i,1} \cdot \exp\left[-\gamma_{xi}\left(x - \sum_{k=2}^{i-1} D_k\right)\right] + B_{i,2} \cdot \exp\left[\gamma_{xi}\left(x - \sum_{k=2}^{i-1} D_k\right)\right]$

. . .
. . .
. . .

$N$-th layer: $\phi_{xN} = B_{N,1} \cdot \exp\left[-\gamma_{xN}\left(x - \sum_{k=2}^{i-1} D_k\right)\right]$ where $B_{i,1}$ is a potential coefficient of the i-th layer for the positive direction of x, $B_{i,2}$ is a potential coefficient of the i-th layer for the negative direction of x, and $D_k$ is the thickness of the k-th layer. Since the potential $\phi$ of the electromagnetic waves is continuous in each layer in the x direction, there is a combination of $\lambda$ and B so that $\phi_{xi}$, where i is an integer not less than 1 and not larger than n, is continuous at the interface of each layer. In order to be continuous at the interface of each layer, the following equation (8) must be satisfied by the equation (7).

$$\begin{aligned}
B_{1,1} &= B_{2,1} + B_{2,2} \\
B_{2,1} &\cdot \exp(-\gamma_{x2} \cdot D_2) + B_{2,2} \cdot \exp(\gamma_{x2} \cdot D_2) \\
&= B_{3,1} + B_{3,2} \\
&\vdots \\
B_{N-1,1} &\cdot \exp(-\gamma_{xN-1} \cdot D_{N-1}) + B_{N-1,2} \cdot \exp(\gamma_{xN-1} \cdot D_{N-1}) \\
&= B_{N,1}
\end{aligned} \qquad (8)$$

When the equation (8) is arranged, the following equation is obtained.

$$\begin{bmatrix} A \end{bmatrix} \begin{bmatrix} B_{1,1} \\ B_{2,1} \\ \vdots \\ B_{N,1} \end{bmatrix} = 0 \qquad (9)$$

where A is a matrix represented by $D_i$ and $y_{xi}$.

The combination of $(y_{x1}, \ldots, y_{xN})$ is determined by the condition where the equation (9) has a solution which is not obvious, det A=0. If the combination of $(y_{x1}, \ldots, y_{xN})$ is determined, $B_{i,j}$ is found from equation (7), thereby obtaining an intensity distribution $\phi_x(x)$ of the electromagnetic wave in each layer. Since $\{f_x(x)\}^2$ is in proportion to the near-field pattern, the near-field pattern of the light emitting surface of the semiconductor laser can be obtained.

The near-field pattern is calculated by successively changing the range of the refractive index $n_i$ and the layer thickness $D_i$ of each layer constituting the semiconductor laser. The combination of $(y_{x1}, \ldots, y_{xN})$ in which the near-field pattern reaches a maximum value at the optical waveguide layer and a value other than 0 at the first and the second laser structures is obtained, whereby the near-field pattern of the light emitting surface of the semiconductor laser with the laminated structure has a single peak.

Figure 4:
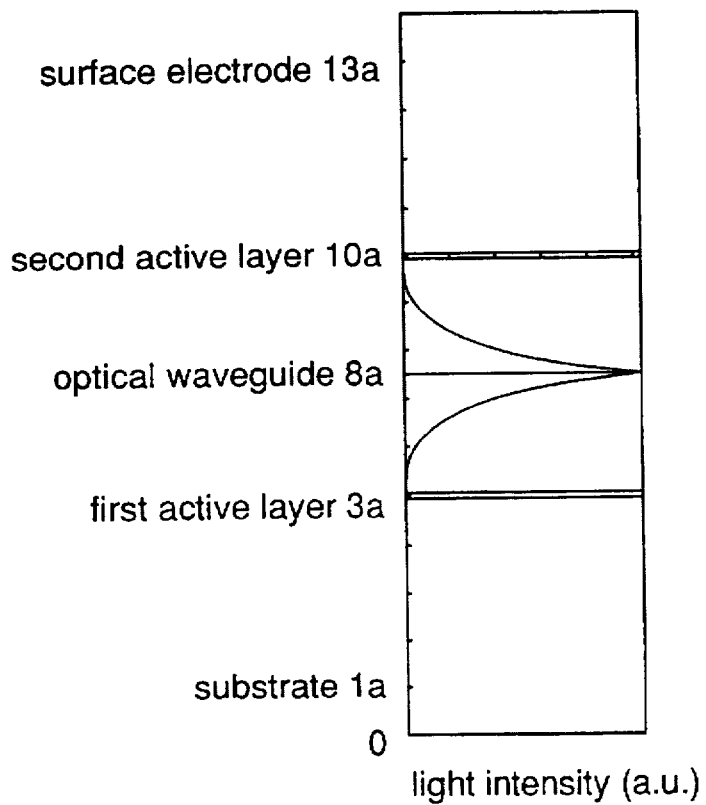
FIG. 4 is a diagram showing a profile of a near-field pattern in the direction perpendicular to the semiconductor laser according to the first example of the first embodiment.

FIG. 4 shows a near-field pattern of the semiconductor laser according to the first example when the thickness $d_3$ of the optical waveguide layer 8a having a refractive index $n_2$ of 3.45 is 0.02 µm<$d_3$<0.09 µm. As is apparent from FIG. 4, since, in the semiconductor laser according to the first example, the Si optical waveguide layer 8a having a refractive index larger than the refractive indices of the InGaAsP first active layer 3a and the InGaAsP second active layer 10a is disposed between the second laser structure 16a and the tunnel diode structure 14a, even though the first laser structure 14a and the tunnel diode structure 16a are widely separated, the near-field pattern of the light emitting surface has a single peak, increasing the output power of the laser.

In the first embodiment, the Si optical waveguide layer is formed on the InP cladding layer. The lattice constant $a_{Si}$ of Si is 5.43 Å and the lattice constant $a_{InP}$ of InP is 5.87 Å, respectively. Since the difference between the lattice constants is as large as about 7%, lattice defects are easily generated at the junctions of the optical waveguide layer.

Figure 5:
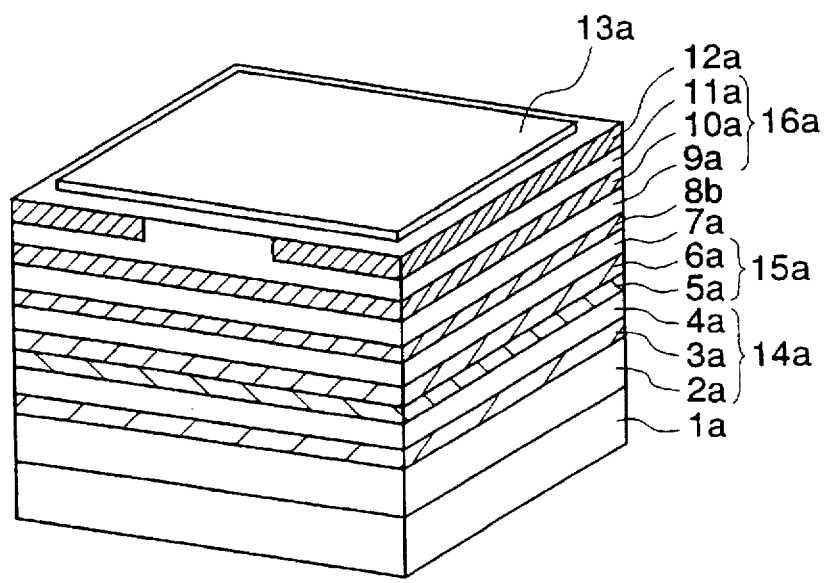
FIG. 5 is a perspective view illustrating a semiconductor laser according to a second example of the first embodiment of the invention.

FIG. 5 is a perspective view illustrating a semiconductor laser according to a second example in the first embodiment of the invention. In FIG. 5, the same reference numerals as in FIG. 2 designate the same parts and the thickness of each semiconductor layer is the same as described in FIG. 2. Reference numeral 8b designates an $In_{1-x}Ga_xAs_{y2}P_{1-y2}$ optical waveguide layer.

The semiconductor laser according to the second example is fundamentally identical to the semiconductor laser according to the first example of the invention except that the first and the second laser structures both comprise an $InGaAs_{y1}P_{1-y1}$ active layer and InP cladding layers, and the optical waveguide layer comprises $InGaAs_{y2}P_{1-y2}$ lattice-matching with InP of the cladding layers, and the composition ratio of As in the first and the second laser structures and the optical waveguide layer is y2>y1.

In $In_{1-x}Ga_xAs_yP_{1-y}$, a relational expression of x=0.1894 y/(0.4184−0.013 y) is achieved between the composition ratios x and y. By increasing the composition ratio of As by $\Delta y$, the refractive index is changed by 0.3140 y.

In the semiconductor laser according to the second example, when the thickness of the optical waveguide layer 8b is 0.2 µm, a relation of 0.004<$n_2$−$n_1$<0.07 is achieved between the refractive index $n_1$ of the laser structure and the refractive index $n_2$ of the optical waveguide layer using the method for obtaining the near-field pattern as described for the first example, i.e., 0.013<$\Delta y$<0.22 is achieved, so that the laser beams generated from the first and the second laser structures 14a and 16a are guided to the optical waveguide layer 8b.

In the semiconductor laser according to the second example, since the first laser structure 14a and the second laser structure 16a both comprise an $InGaAs_{y1}P_{1-y1}$ active layer and InP cladding layers, and the $InGaAs_{y2}P_{1-y2}$ optical waveguide layer 8b having a refractive index larger than the refractive index of $InGaAs_{y1}P_{1-y1}$ and lattice-matching with InP is disposed between the second laser structure 16a and the tunnel diode structure 15a, even though the first laser structure 14a and the second laser structure 16a are widely separated, the laser beam at the light emitting surface has a single peak, increasing the output power of the laser.

Figure 6:
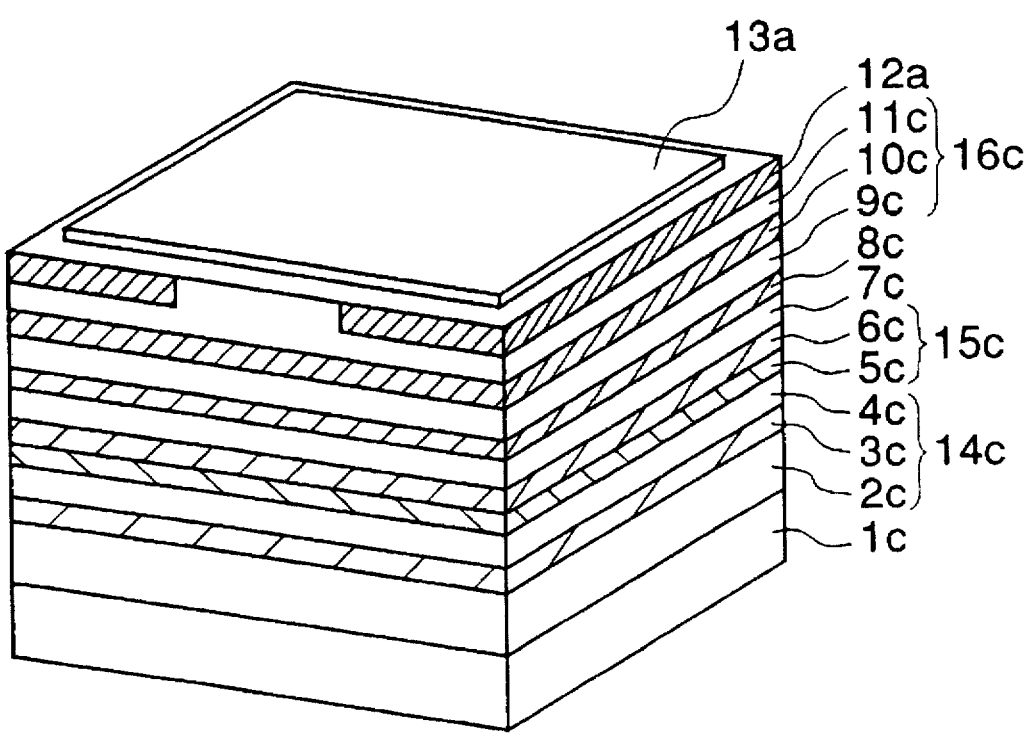
FIG. 6 is a perspective view illustrating a semiconductor laser according to a third example of the first embodiment of the invention.

FIG. 6 is a perspective view illustrating a semiconductor laser according to a third example of the first embodiment of the present invention. In FIG. 6, reference numeral 1c designates an n type GaAs semiconductor substrate. An n type $Al_{0.34}Ga_{0.66}As$ cladding layer 2c having a prescribed thickness is disposed on the n type GaAs semiconductor substrate 1c. An $Al_{0.12}Ga_{0.88}As$ first active layer 3c having a thickness of 0.1 μm is disposed on the n type InP cladding layer 2c. A p type $Al_{0.34}Ga_{0.66}As$ cladding layer 4c having a thickness of 3.6 μm is disposed on the first active layer 3c. A first laser structure 14c includes the n type $Al_{0.34}Ga_{0.66}As$ cladding layer 2c, the first active layer 3c, and the p type $Al_{0.34}Ga_{0.66}As$ cladding layer 4c. A $p^+$ type $Al_{0.34}Ga_{0.66}As$ layer 5c doped with a dopant impurity to a high concentration and having a thickness of 0.2 μm is disposed on the first laser structure 14c. An $n^+$ type $Al_{0.34}Ga_{0.66}As$ layer 6c doped with a dopant impurity to a high concentration and having a thickness of 0.2 μm is disposed on the $p^+$ type $Al_{0.34}Ga_{0.66}As$ layer 5c. A tunnel diode structure 15c is formed by the $p^+n^+$ junction of the $p^+Al_{0.34}Ga_{0.66}As$ layer 5c and the $n^+$ type $Al_{0.34}Ga_{0.66}As$ layer 6c. In addition, an n type $Al_{0.34}Ga_{0.66}As$ cladding layer 7c having a thickness of 1 μm is disposed on the tunnel diode structure 15c. A GaAs optical waveguide layer 8c is disposed on the n type $Al_{0.34}Ga_{0.66}As$ cladding layer 7c. An n type $Al_{0.34}Ga_{0.66}As$ cladding layer 9c having a thickness of 5 μm is disposed on the optical waveguide layer 8c, an $Al_{0.12}Ga_{0.88}As$ second active layer 10c having a thickness of 0.1 μm is disposed on the n type $Al_{0.34}Ga_{0.66}As$ cladding layer 9c, and a p type $Al_{0.34}Ga_{0.66}As$ cladding layer 11c having a prescribed thickness is disposed on the second active layer 10c. A second laser structure 16c includes the n type $Al_{0.34}Ga_{0.66}As$ cladding layer 9c, the second active layer 10c, and the p type $Al_{0.34}Ga_{0.66}As$ cladding layer 11c. Reference numeral 12c designates an $SiO_2$ insulating film disposed on the p type $Al_{0.34}Ga_{0.66}As$ cladding layer 11c for concentrating current flow, and numeral 13c designates an Au surface electrode having a thickness of 4 μm and disposed on the insulating film 12c.

The semiconductor laser according to the third example is fundamentally identical to the semiconductor laser according to the first example of the invention except that the first laser structure and the second laser structure both comprise an $Al_{0.12}Ga_{0.88}As$ active layer and $Al_{0.34}Ga_{0.66}As$ cladding layers having a composition ratio of Al larger than the composition ratio of the active layer, and the optical waveguide layer comprises GaAs.

In the semiconductor laser according to the third example, the oscillation wavelength λ is 0.85 μm, the refractive index $n_3$ of $Al_{0.34}Ga_{0.66}As$ of the cladding layers is 3.40, the refractive index $n_1$ of $Al_{0.12}Ga_{0.88}As$ of the laser structure is 3.56, and the refractive index $n_2$ of GaAs of the optical waveguide layer is 3.65. When the layer thickness $d_3$ of the GaAs optical waveguide layer 8c is 0.008<d<0.04 μm, even though the first laser structure 14c and the second laser structure 16c are widely separated, the laser beams generated from the laser structures are guided to the optical waveguide layer 8c, thereby increasing the output power of the laser.

In the third example, the optical waveguide layer comprises AlGaAs having a composition ratio of Al smaller than the composition ratio of the laser structure so that the refractive index $n_2$ of the optical waveguide layer is larger than the refractive index $n_1$ of the laser structure. Therefore, the band gap energy of the optical waveguide layer is smaller than the band gap energy of the laser structure, the laser beams are absorbed in the optical waveguide layer, and the output power of the laser deteriorates.

Figure 7:
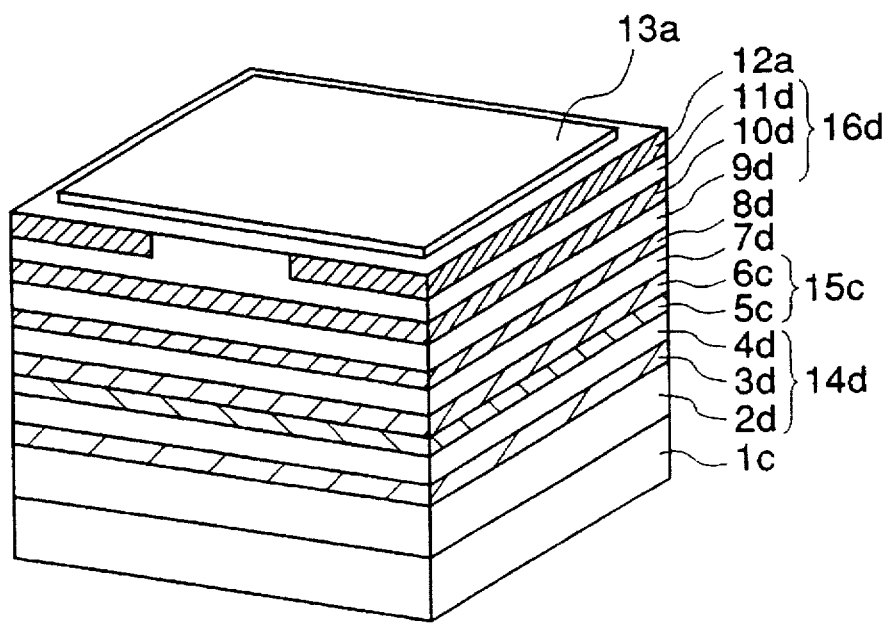
FIG. 7 is a perspective view illustrating a semiconductor laser according to a fourth example of the first embodiment of the invention.

In a fourth example, a semiconductor laser is constructed for preventing the described problems. FIG. 7 is a perspective view illustrating a semiconductor laser according to a fourth example in the first embodiment of the invention. In FIG. 7, reference numerals 2d, 7d, and 9d designate n type $Al_{x2}Ga_{1-x2-y2}As$ cladding layers, numeral 3d designates an $Al_{x1}Ga_{1-x1-y1}In_{y1}As$ first active layer, numerals 4d and 11d designate p type $Al_{x2}Ga_{1-x2-y2}In_{y2}As$ cladding layers, numeral 8d designates an $Al_{x3}Ga_{1-x3-y3}In_{y3}As$ optical waveguide layer, and numeral 10d designates an $Al_{x1}Ga_{1-x1-y1}In_{y1}As$ second active layer. A first laser structure 14d includes the n type $Al_{x2}Ga_{1-x2-y2}In_{y2}As$ cladding layer 2d, the first active layer 3d, and the p type $Al_{x2}Ga_{1-x2-y2}In_{y2}As$ cladding layer 4d, and the second laser structure 16d includes the n type $Al_{x2}Ga_{1-x2-y2}In_{y2}As$ cladding layer 9d, the second active layer 10d, and the p type $Al_{x2}Ga_{1-x2-y2}In_{y2}As$ cladding layer 11d, respectively. In addition, the thickness of each layer is the same described in the third a example, and the same reference numerals as in FIG. 6 designate the same parts.

The semiconductor laser according to the fourth example is fundamentally identical to the semiconductor laser according to the first example of the invention except that the first and the second laser structures, the cladding layers, and the optical waveguide layer respectively comprise $Al_xGa_{1-x-y}In_yAs$, each having the different composition ratio.

The refractive index $n(x, y)$ and the band gap energy $Eg(x, y)$ of $Al_xGa_{1-x-y}In_yAs$ are respectively represented by $$n(x, y) = 3.65 - 0.73\ x - 1.27\ y \quad Eg(x, y) = 1.42 + 1.25\ x - 2.47\ y \quad (10)$$

Here, in order to prevent the laser beams generated in the laser structures and guided to the optical waveguide layer from being absorbed in the optical waveguide layer, the refractive index $n_2$ of the optical waveguide layer should be larger than the refractive index $n_1$ of the laser structure, and the band gap energy of the optical waveguide layer should be larger than the band gap energy of the laser structure. That is, $(x_1, y_1)$, $(x_2, y_2)$, and $(x_3, y_3)$ should be determined to satisfy the following equations.

$$Eg(x_1, y_1) < Eg(x_2, y_2) \quad (11)$$
$$Eg(x_1, y_1) < Eg(x_3, y_3)$$
$$n(x_2, y_2) < n(x_1, y_1) < n(x_3, y_3)$$

When equations (10) are substituted in these equations (11), the following equations (12) are obtained.

$$0.73(x_2 - x_1) + 1.27(y_2 - y_1) > 0 \quad (12)$$
$$0.73(x_1 - x_3) + 1.27(y_1 - y_3) > 0$$
$$-1.25(x_1 - x_3) + 2.47(y_1 - y_3) > 0$$
$$-1.25(x_1 - x_2) + 2.47(y_1 - y_2) > 0$$

If the composition ratios of $Al_xGa_{1-x-y}In_yAs$ in the active layer, the cladding layer, and the optical waveguide layer are respectively determined to satisfy equations (12), the laser beams generated in the laser structures are guided to the optical waveguide layer and absorption of the laser beams in the optical waveguide layer is suppressed.

The semiconductor laser according to the fourth example is fundamentally identical to the semiconductor laser according to the first embodiment of the invention except that the first and the second active layers both comprise $Al_{x1}Ga_{1-x1-y1}In_{y1}As$, the cladding layers comprise $Al_{x2}Ga_{1-x2-y2}In_{y2}As$, and the optical waveguide layer comprises $Al_{x3}Ga_{1-x3-y3}In_{y3}As$, and equations (12) are satisfied by the composition ratio. Therefore, the laser beams generated by the first and the second laser structures 14d and 16d are guided to the optical waveguide layer 8d and absorption of the laser beams in the optical waveguide layer 8d is suppressed, further increasing the output power and the efficiency of the laser.

Embodiment 2

Figure 1:
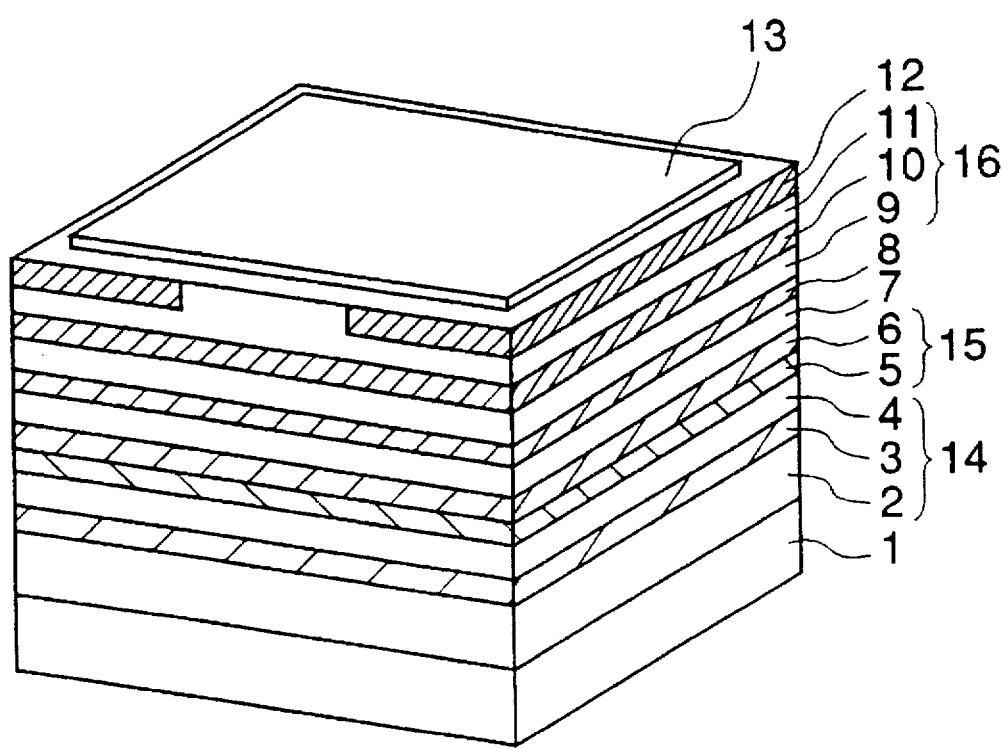
FIG. 1 is a perspective view illustrating a semiconductor laser according to a first embodiment of the present invention.

While in the first embodiment of the invention the optical waveguide layer 8 is disposed between the cladding layer 9 of the second laser structure 16 and the cladding layer 7 on the tunnel diode structure 15 as shown in FIG. 1, in a second embodiment of the invention the optical waveguide layer 8 may be disposed in the cladding layer 4 between the first laser structure 14 and the tunnel diode structure 15 with the same effect as described in the first embodiment of the invention.

Figure 8:
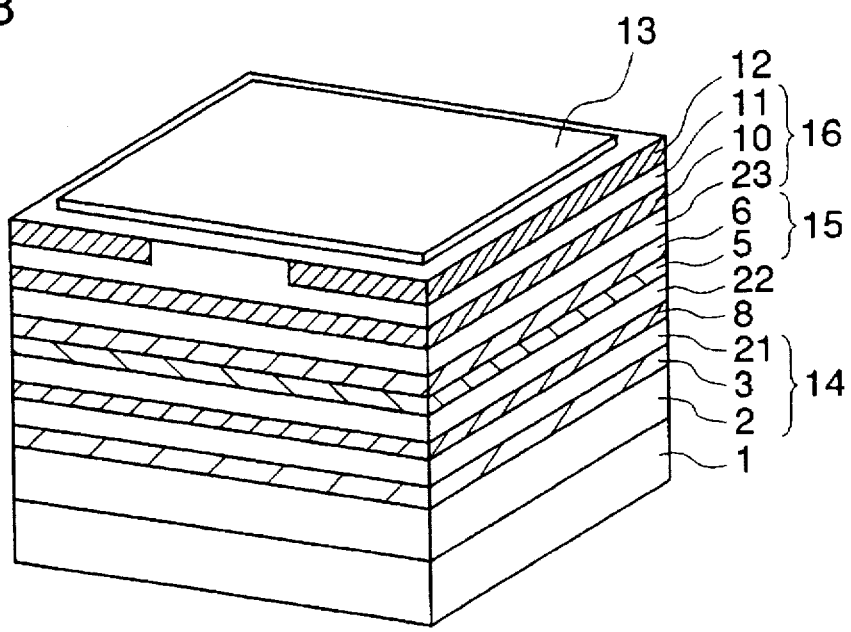
FIG. 8 is a perspective view illustrating a semiconductor laser according to a second embodiment of the present invention.

In the semiconductor laser according to the second embodiment of the invention, as shown in FIG. 8, the first laser structure 14, the tunnel diode structure 15, and the second laser structure 16 are successively formed, and the forward directions of the first laser structure 14 and of the second laser structure 16 are the same as the forward direction of the semiconductor laser and the forward direction of the tunnel diode structure 15 is reverse to the forward direction of the semiconductor laser. In the semiconductor laser in which the laser beams are generated when a current flows in the forward direction, the optical waveguide layer 8, having a refractive index larger than the refractive indices of the first laser structure 14 and the second laser structure 16, is disposed between the first laser structure 14 and the tunnel diode structure 15. Even though the first laser structure 14 and the second laser structure 16 are widely separated, the laser beam at the light emitting surface has a single peak, increasing the output power of the laser.

Figure 9:
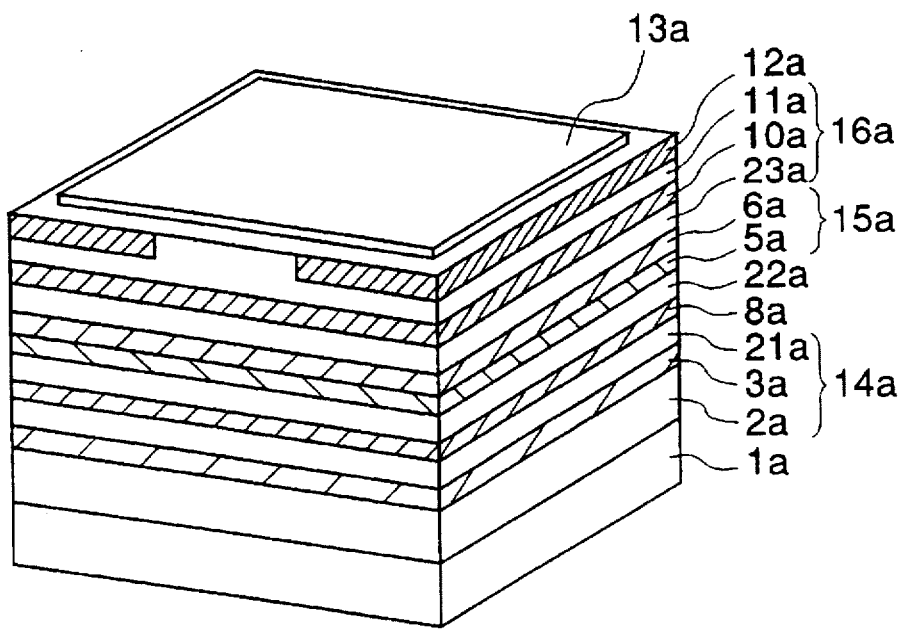
FIG. 9 is a perspective view illustrating a semiconductor laser according to a first example of the second embodiment of the invention.

FIG. 9 is a perspective view illustrating a semiconductor laser according to a first example of the second embodiment of the present invention. In FIG. 9, reference numeral 21a designates a p type InP cladding layer having a thickness of 5 μm and disposed on the first active layer 3a, numeral 22a designates a p type InP cladding layer having a thickness of 1 μm and disposed on the optical waveguide layer 8a, and numeral 23a designates an n type InP cladding layer having a thickness of 3.6 μm and disposed on the tunnel diode structure 15a. In addition, the same reference numerals as in FIG. 2 designate the same parts.

While in the semiconductor laser according to the first example of the first embodiment the optical waveguide layer 8a was disposed between the cladding layer 7a on the tunnel diode structure 15a and the cladding layer 9a of the second laser structure 16a, in the semiconductor laser according to the first example of the second embodiment the optical waveguide layer 8a is disposed between the cladding layer 21a of the first laser structure 14a and the cladding layer 22a on the tunnel diode structure 15a.

In the semiconductor laser according to the first example of the second embodiment, as in the semiconductor laser according to the first example of the first embodiment, by making the thickness $d_3$ of the optical waveguide layer 8a $0.02<d_3<0.09$ μm, even though the first and the second laser structures 14a and 16a are widely separated, the laser beams at the light emitting surface has a single peak, increasing the output power of the laser.

Figure 10:
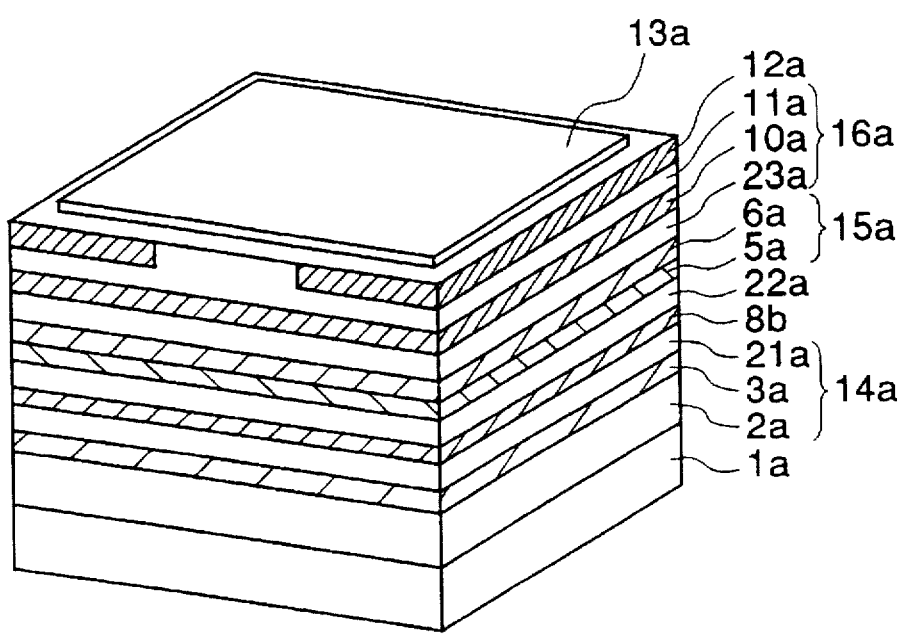
FIG. 10 is a perspective view illustrating a semiconductor laser according to a second example of the second embodiment of the invention.

FIG. 10 is a perspective view illustrating a semiconductor laser according to a second example of the second embodiment of the present invention. In fibre 10, reference numeral 21a designates a p type InP cladding layer having a thickness of 5 μm and disposed on the first active layer 3a, numeral 22a designates a p type InP cladding layer having a thickness of 1 μm and disposed on the optical waveguide layer 8a, and numeral 23a designates an n type InP cladding layer having a thickness of 3.6 μm and disposed on the tunnel diode structure 15a. In addition, the same reference numerals as in FIG. 5 designate the same parts.

While in the semiconductor laser according to the second example of the first embodiment the optical waveguide layer 8b was disposed between the cladding layer 7 on the tunnel diode structure 15 and the cladding layer 9 of the second laser structure 16, in the semiconductor laser according to the second example of the second embodiment the optical waveguide layer 8b is disposed between the cladding layer 21a of the first laser structure 14a and the cladding layer 22a below the tunnel diode structure 15a.

In the semiconductor laser according to the second example, the first laser structure 14a and the second laser structure 16a both comprise an $n^+$ type $InGaAs_{y1}P_{1-y1}$ active layer and InP cladding layers, and the optical waveguide layer 8b comprising $InGaAs_{y2}P_{1-y2}$ having a refractive index larger than the refractive index of $InGaAs_{y1}P_{1-y1}$ and lattice-matching with InP is disposed between the first laser structure 14a and the tunnel diode structure 15a. Therefore, as in the second example of the first embodiment, even though the first laser structure 14a and the second laser structure 16a are widely separated, the laser beam at the light emitting surface has a single peak, increasing the output power of the laser.

Figure 11:
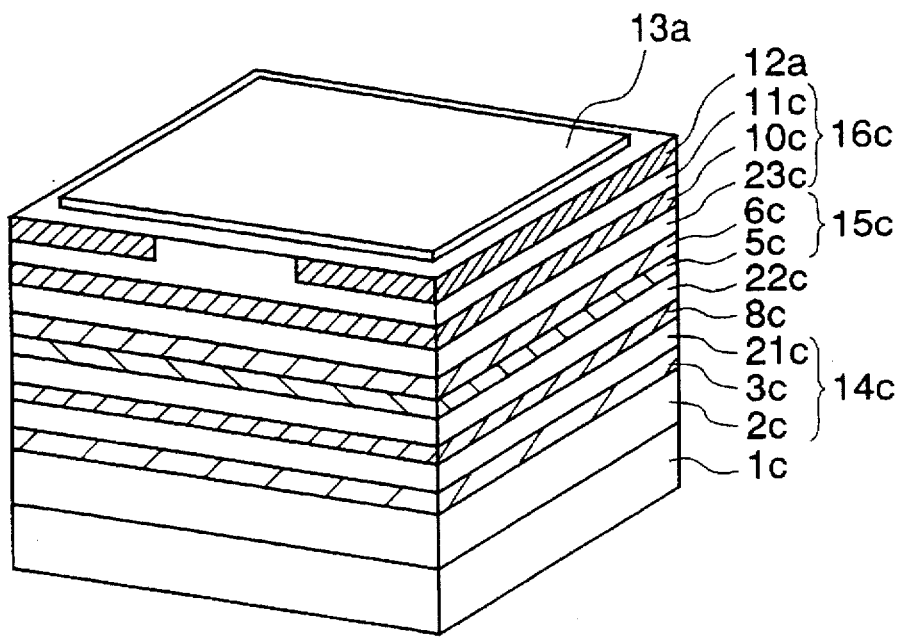
FIG. 11 is a perspective view illustrating a semiconductor laser according to a third example of the second embodiment of the invention.

FIG. 11 is a perspective view illustrating a semiconductor laser according to a third example of the second embodiment of the present invention. In FIG. 11, reference numeral 21c designates a p type $n^+$ type $Al_{0.34}Ga_{0.66}As$ cladding layer having a thickness of 5 μm and disposed on the first active layer 3c, numeral 22c designates a p type $Al_{0.34}Ga_{0.66}As$ cladding layer having a thickness of 1 μm and disposed on the optical waveguide layer 8c, and numeral 23c designates an n type $Al_{0.34}Ga_{0.66}As$ cladding layer having a thickness of 3.6 μm and disposed on the tunnel diode structure 15c. In addition, the same reference numerals as in FIG. 6 designate the same parts.

While in the semiconductor laser according to the third example of the first embodiment the optical waveguide layer 8c was disposed between the cladding layer 7c on the tunnel diode structure 15c and the cladding layer 9c of the second laser structure 16c, in the semiconductor laser according to the third example of the second embodiment the optical waveguide layer 8c is disposed between the cladding layer 21c of the first laser structure 14c and the cladding layer 22c below the tunnel diode structure 15c.

In the semiconductor laser according to the third example, as in the semiconductor laser according to the third example of the first embodiment, even though the first laser structure 14c and the second laser structure 16c are widely separated, the laser beams generated from the laser structures are guided to the optical waveguide layer 8c, increasing the output power of the laser.

Figure 12:
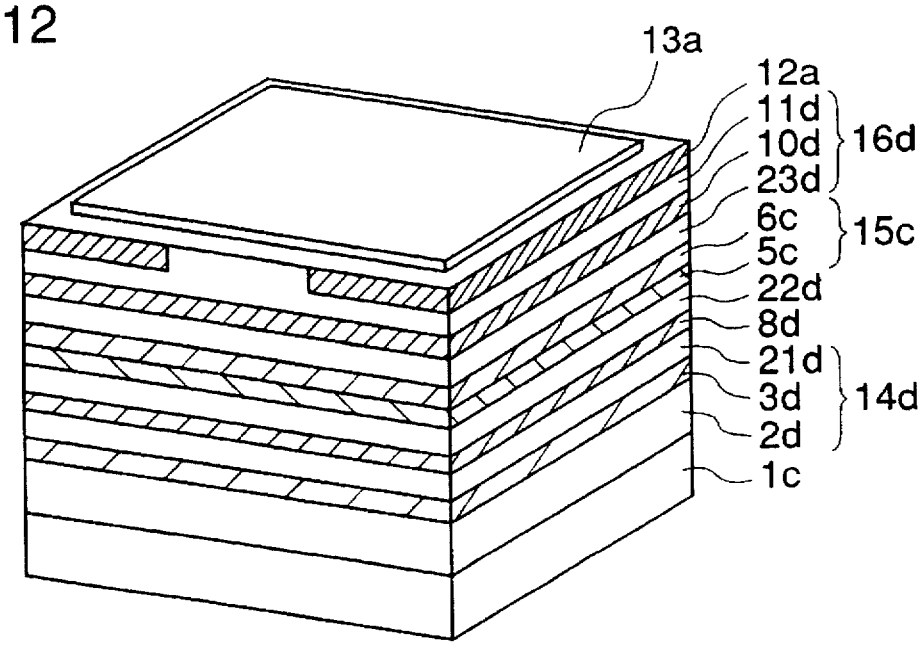
FIG. 12 is a perspective view illustrating a semiconductor laser according to a fourth example of the second embodiment of the invention.
Figure 13:
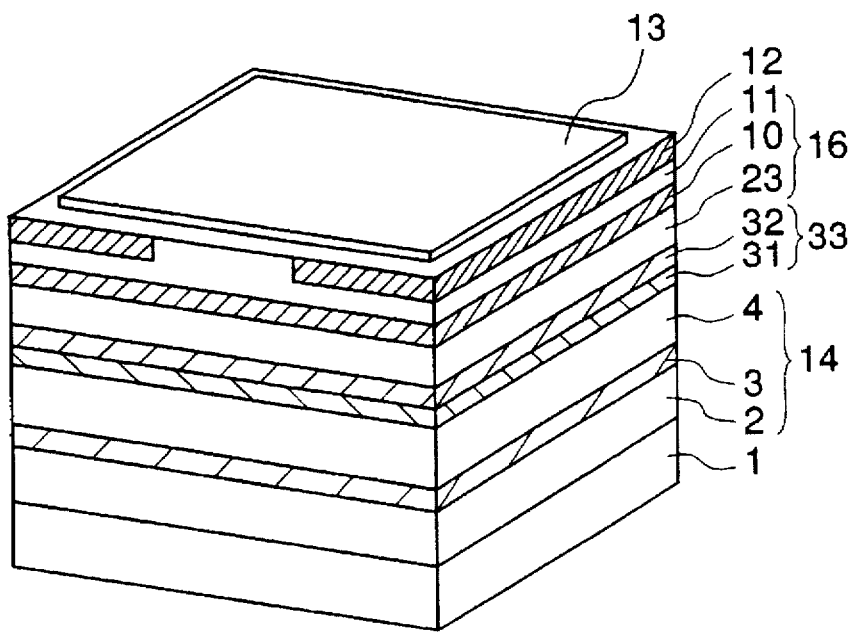
FIG. 13 is a perspective view illustrating a semiconductor laser according to a third embodiment of the present invention.

FIG. 12 is a perspective view illustrating a semiconductor laser according to a fourth example of the second embodiment of the present invention. In FIG. 12, reference numeral 21d designates a p type $Al_{x2}Ga_{1-x2-y2}In_{y2}As$ cladding layer having a thickness of 5 µm and disposed on the first active layer 3d, numeral 22d designates a p type $Al_{x2}Ga_{1-x2-y2}In_{y2}As$ cladding layer having a thickness of 1 µm and disposed on the optical waveguide layer 8d, and numeral 23d designates an n type $Al_{x2}Ga_{1-x2-y2}As$ cladding layer having a thickness of 3.6 µm and disposed on the tunnel diode structure 15c. In addition, the same reference numerals as in FIG. 7 designate the same parts.

While in the semiconductor laser according to the fourth example of the first embodiment the optical waveguide layer 8d was disposed between the cladding layer 7d on the tunnel diode structure 15c and the cladding layer 9d of the second laser structure 16d, in the semiconductor laser according to the fourth example of the second embodiment the optical waveguide layer 8d is disposed between the cladding layer 21d of the first laser structure 14d and the cladding layer 22d below the tunnel diode structure 15c.

In the semiconductor laser according to the fourth example, as in the semiconductor laser according to the fourth example of the first embodiment, the laser beams generated from the first and the second laser structures 14d and 16d are guided to the optical waveguide layer 8d and absorption of the laser beams in the optical waveguide layer 8d is suppressed, increasing the output power and the efficiency of the laser.

Embodiment 3

Since, in the semiconductor laser according to the first and second embodiments of the invention, the optical waveguide layer 8 is disposed between the first laser structure 14 and the tunnel diode structure 15 as shown in FIG. 8 or between the second laser structure 16 and the tunnel diode structure 15 as shown in FIG. 1, the number of grown crystalline layers is increased by two layers as compared with that of the prior art semiconductor laser and the process steps are complicated.

A semiconductor laser according to a third embodiment of the invention is directed to solving this problem. In the semiconductor laser according to the third embodiment, the first laser structure 14, the tunnel diode structure 33, and the second laser structure 16 are successively formed, and the forward directions of the first laser structure 14 and the second laser structure 16 are the same as the forward direction of the semiconductor laser and the forward direction of the tunnel diode structure 33 is reverse to the forward direction of the semiconductor laser. In the semiconductor laser in which the laser beams are generated when a current flows in the forward direction, the tunnel diode structure 33 comprises a semiconductor having a refractive index larger than the refractive indices of the first and the second laser structures 14 and 16, thereby functioning as the optical waveguide layer. Therefore, even though the number of the grown crystalline layers is the same as that of the prior art semiconductor laser and the first laser structure 14 and the second laser structure 16 are widely separated, the laser beam at the light emitting surface has a single peak, increasing the output power of the laser.

Figure 14:
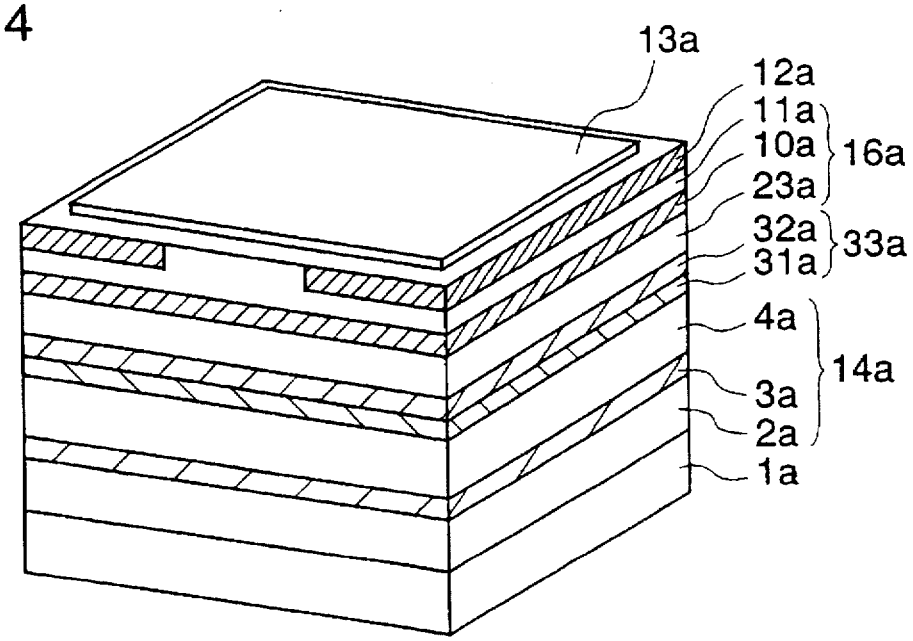
FIG. 14 is a perspective view illustrating a semiconductor laser according to a first example of the third embodiment of the invention.

FIG. 14 is a perspective view illustrating a semiconductor laser according to a first example of the third embodiment of the present invention. In FIG. 14, reference numeral 31a designates a p⁺ type Si layer doped with a dopant impurity to a high concentration and having a thickness of $d_{31a}$ µm and numeral 32a designates an n⁺ type Si layer doped with a dopant impurity to a high concentration and having a thickness of $d_{32a}$ µm. A tunnel diode structure 33a is formed by the p⁺n⁺ junction of the p⁺ type Si layer 31a and the n⁺ type Si layer 32a. In addition, the same reference numerals as in FIGS. 2 and 9 designate the same parts.

The semiconductor laser according to the first example of the third embodiment is fundamentally identical to the semiconductor laser according to the third embodiment of the invention except that the first and the second laser structures, the cladding layers, the p type high dopant concentration layer, and the n type high dopant concentration layer respectively comprise InGaAsP, InP, a p⁺ type Si layer, and an n⁺ type Si layer.

In the semiconductor laser according to the first example of the third embodiment, when the thickness of the tunnel diode structure 33a functioning as the optical waveguide layer, i.e., $d_{31a}$, $d_{32a}$, is 0.02 µm<$d_{31a}$+$d_{32a}$<0.09 µm, as in the semiconductor laser according to the first example of the first embodiment, even though the first laser structure 14a and the second laser structure 16a are widely separated, the laser beam at the light emitting surface has a single peak, whereby a semiconductor laser with improved output power and a simple construction is obtained.

Figure 15:
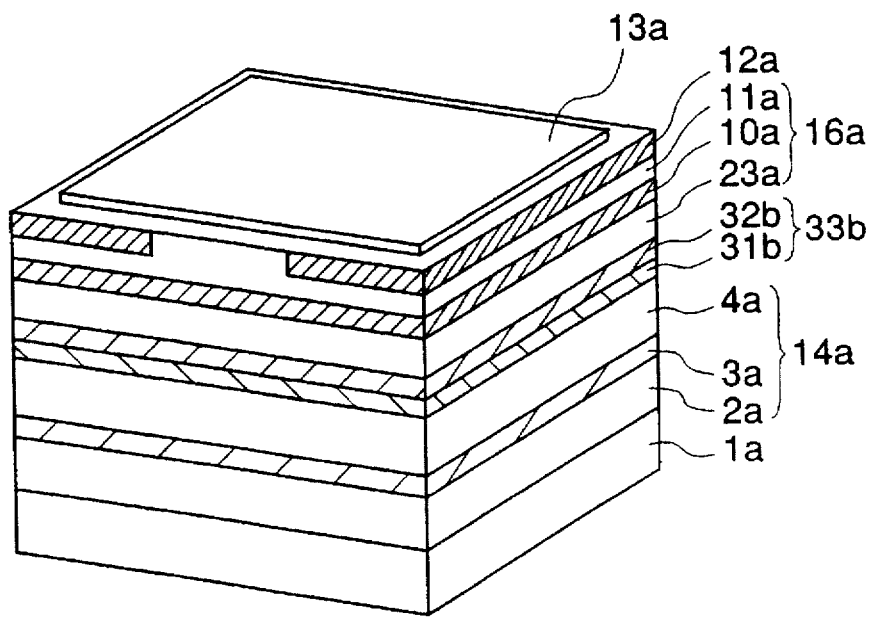
FIG. 15 is a perspective view illustrating a semiconductor laser according to a second example of the third embodiment of the invention.

FIG. 15 is a perspective view illustrating a semiconductor laser according to a second example of the third embodiment of the present invention. In FIG. 15, reference numeral 31b designates a p⁺ type $InGaAs_{y2}P_{1-y2}$ layer doped with a dopant impurity to a high concentration and having a thickness of $d_{31b}$ µm and numeral 32b designates an n⁺ type $InGaAs_{y2}P_{1-y2}$ layer doped with a dopant impurity to a high concentration and having a thickness of $d_{32b}$ µm. A tunnel diode structure 33b is formed by the p⁺n⁺ junction of the p⁺ type $InGaAs_{y2}P_{1-y2}$ layer 31b and the n⁺ type $InGaAs_{y2}P_{1-y2}In_{y2}$ layer 32b, and the layer thickness of $d_{31a}$+$d_{32a}$ is 0.2 µm. In addition, the same reference numerals as in FIGS. 5 and 10 designate the same parts.

The semiconductor laser according to the second example of the third embodiment is fundamentally identical to the semiconductor laser according to the third embodiment of the invention except that the first and the second laser structures both comprise an $InGaAs_{y1}P_{1-y1}$ active layer and InP cladding layers, and the high dopant concentration layer for forming the tunnel diode structure 33b comprises $InGaAs_{y2}P_{1-y2}$ lattice matching with InP of the cladding layer. The composition ratios of As of the high dopant concentration layers of the first and the second laser structures and the tunnel diode structure is y2<y1.

In the semiconductor laser according to the second example of the third embodiment, the first and the second laser structures 14a and 16a both comprise the $InGaAs_{y1}P_{1-y1}$ active layer and the InP cladding layer, and the tunnel diode structure 33b comprises the $InGaAs_{y2}P_{1-y2}In_{y2}As$ layer having a refractive index larger than the refractive index of $InGaAs_{y1}P_{1-y1}$ and lattice-matching with InP. Therefore, as in the semiconductor laser according to the second example of the first embodiment, even though the first laser structure 14a and the second laser structure 16a are widely separated, the laser beam at the light emitting surface has a single peak, whereby a semiconductor laser with improved output power and a simple construction is obtained.

Figure 16:
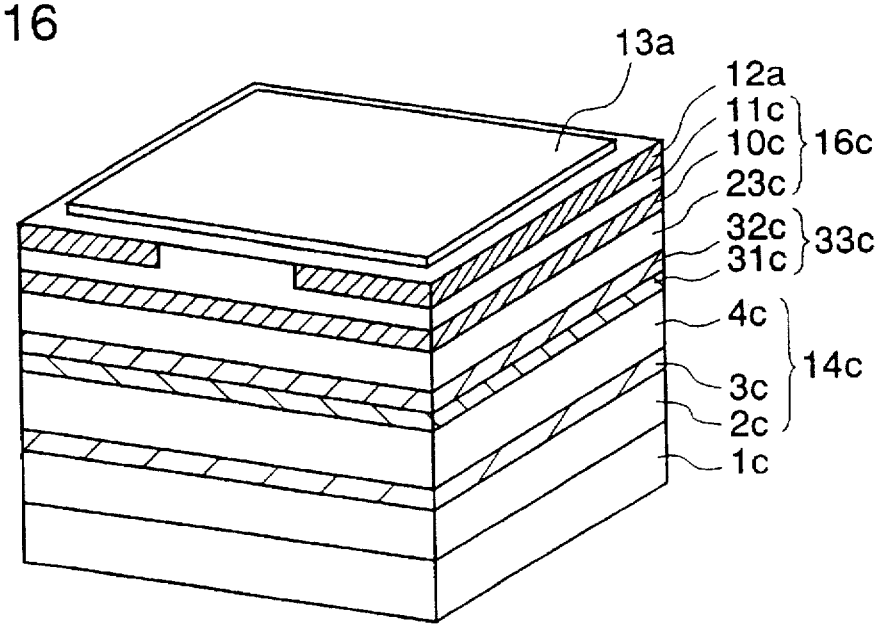
FIG. 16 is a perspective view illustrating a semiconductor laser according to a third example of the third embodiment of the invention.

FIG. 16 is a perspective view illustrating a semiconductor laser according to a third example of the third embodiment of the present invention. In FIG. 16, reference numeral 31c designates a $p^+$ type GaAs layer doped with a dopant impurity to a high concentration and having a thickness of $d_{31c}$ µm and numeral 32c designates an $n^+$ type GaAs layer doped with a dopant impurity to a high concentration and having a thickness of $d_{32c}$ µm. A tunnel diode structure 33c is formed by the $p^+n^+$ junction of the $p^+$ type GaAs layer 31c and the $n^+$ type GaAs layer 32c. In addition, the same reference numerals as in FIGS. 6 and 11 designate the same parts.

The semiconductor laser according to the third example of the third embodiment is fundamentally identical to the semiconductor laser according to the third embodiment of the invention except that the first and the second laser structures, the cladding layers, and the tunnel diode structure respectively comprise $Al_{0.12}Ga_{0.88}As$, $Al_{0.34}Ga_{0.66}As$ having a composition ratio of Al larger than the composition ratio of the laser structure, and GaAs.

In the semiconductor laser according to the third example of the third embodiment, when the layer thickness of the tunnel diode structure 33c functioning as the optical waveguide layer, i.e., $d_{31c}+d_{32c}$, is made 0.008 µm<$d_{31c}+d_{32c}$<0.04 µm, as in the semiconductor laser according to the third example of the first embodiment, even though the first laser structure 14c and the second laser structure 16c are widely separated, the laser beam at the light emitting surface has a single peak, whereby a semiconductor laser with improved output power and a simple construction is obtained.

Figure 17:
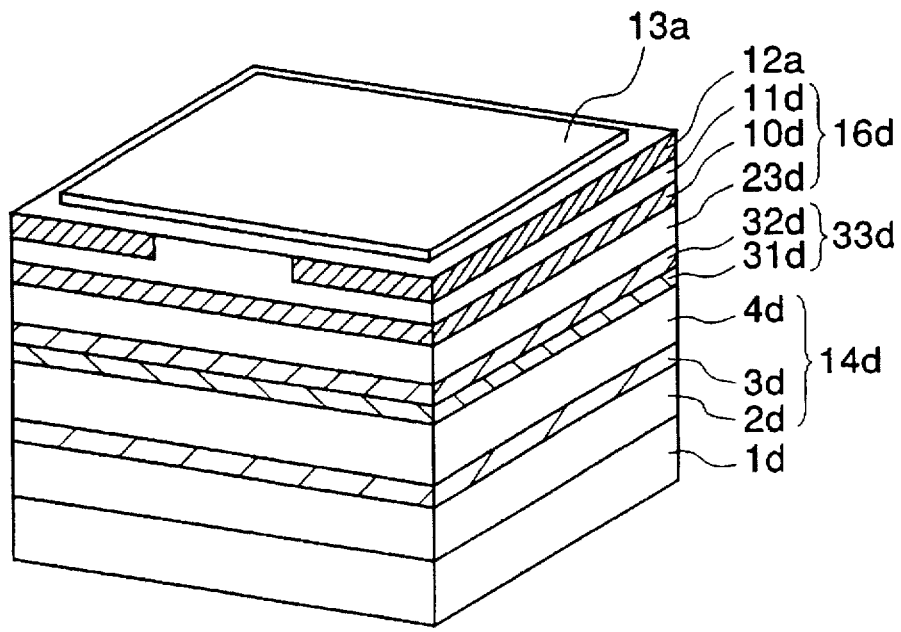
FIG. 17 is a perspective view illustrating a semiconductor laser according to a fourth example of the third embodiment of the invention.
Figure 18:
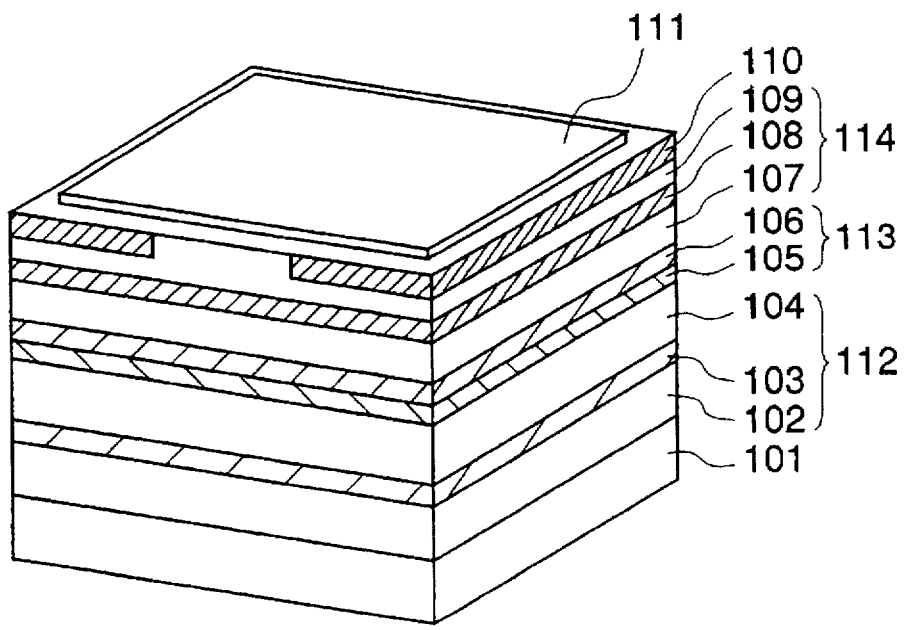
FIG. 18 is a perspective view illustrating a prior art semiconductor laser.
Figure 19:
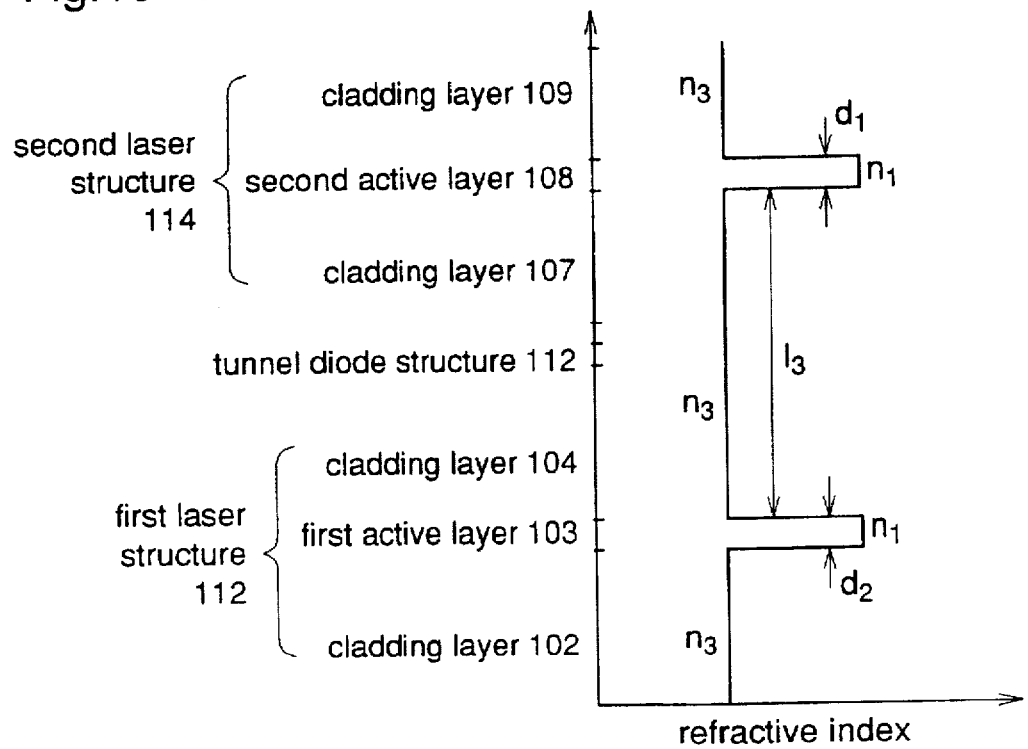
FIG. 19 is a diagram showing a profile of the refractive index in a vertical cross-section of the prior art semiconductor laser.
Figure 20:
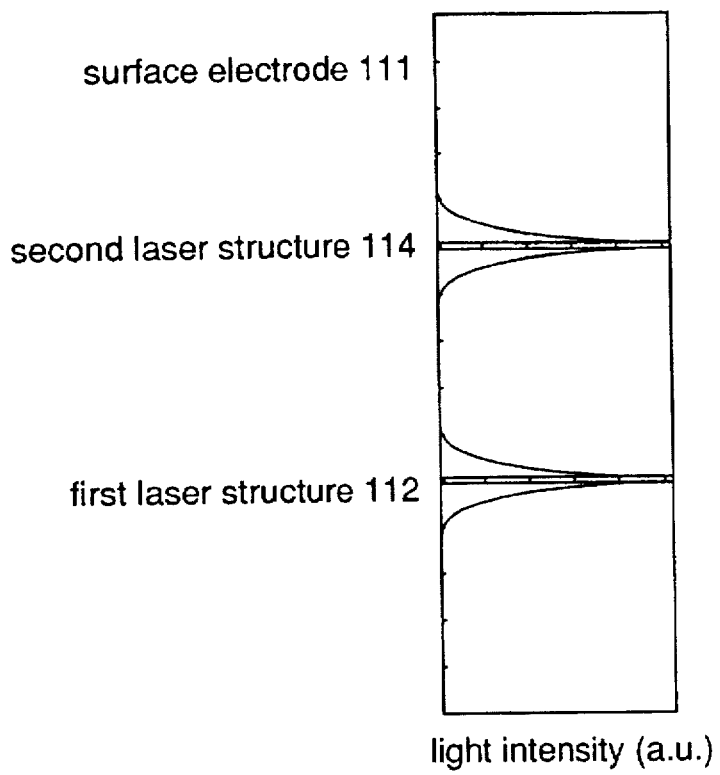
FIG. 20 is a diagram showing a profile of near-field pattern in the direction perpendicular to the prior art semiconductor laser.

FIG. 17 is a perspective view illustrating a semiconductor laser according to a fourth example of the third embodiment of the present invention. In FIG. 17, reference numeral 31d designates a $p^+$ type $Al_{x3}Ga_{1-x3-y3}In_{y3}As$ layer doped with a dopant impurity to a high concentration and numeral 32d designates an $n^+$ type $Al_{x3}Ga_{1-x3-y3}In_{y3}As$ layer doped with a dopant impurity to a high concentration. A tunnel diode structure 33d is formed by the $p^+n^+$ junction of the $p^+$ type $Al_{x3}Ga_{1-x3-y3}As$ layer 31d and the $n^+$ type $Al_{x3}Ga_{1-x3-y3}In_{y3}As$ layer 32d. In addition, the same reference numerals as in FIGS. 7 and 12 designate the same parts.

In the semiconductor laser according to the fourth example of the third embodiment, as in the semiconductor laser according to the fourth example of the first embodiment, the laser beams generated by the first laser structure 14d and the second laser structure 16d are guided to the optical waveguide layer 8d, and absorption of the laser beams in the optical waveguide layer is suppressed, whereby a semiconductor laser with improved output power and efficiency and having a simple construction is obtained.

What is claimed is:

1. A semiconductor laser comprising:
  a first laser structure having a refractive index, a tunnel diode structure, and a second laser structure having a refractive index, successively arranged so that forward directions of the first laser structure and the second laser structure are the same as a forward direction of the semiconductor laser, and a forward direction of the tunnel diode structure is reverse to the forward direction of the semiconductor laser, wherein laser light is generated when a current flows in the forward direction of the semiconductor laser; and
  an optical waveguide layer having a larger refractive index than the refractive indices of the first laser structure and the second laser structure and located between the tunnel diode structure and one of the first and second laser structures.

2. The semiconductor laser of claim 1 wherein the first laser structure and the second laser structure comprise respective active layers comprising InGaAsP and cladding layers comprising InP, and the optical waveguide layer comprises Si.

3. The semiconductor laser of claim 1 wherein:
  the first laser structure and the second laser structure include respective active layers comprising $InGaAs_{y1}P_{1-y1}$ and cladding layers comprising InP,
  the optical waveguide layer comprises $InGaAs_{y2}P_{1-y2}$ lattice matching with InP, and $y2>y1$.

4. The semiconductor laser of claim 1 wherein:
  the first laser structure and the second laser structure include respective active layers comprising $Al_{x1}Ga_{1-x1}As$ and cladding layers comprising $Al_{x2}Ga_{1-x2}As$,
  the optical waveguide layer comprises $Al_{x3}Ga_{1-x3}As$ $x3\leq1$, and $x3<x1<x2$.

5. The semiconductor laser of claim 1 wherein:
  the first laser structure and the second laser structure include respective active layers comprising $Al_{x1}Ga_{1-x1-y1}In_{y1}As$ and cladding layers comprising $Al_{x2}Ga_{1-x2-y2}In_{y2}As$,
  the optical waveguide layer comprises $Al_{x3}Ga_{1-x3-y3}In_{y3}As$, and $0.73(x2-x1)+1.27(y2-y1)>0$
  $0.73(x1-x3)+1.27(y1-y3)>0$
  $-1.25(x1-x3)+2.47(y1-y3)>0$
  $-1.25(x1-x2)+2.47(y1-y2)>0$.

6. A semiconductor laser comprising:
  a first laser structure including an active layer comprising $InGaAs_{y1}P_{1-y1}$, cladding layers comprising InP, a tunnel diode structure comprising $InGaAs_{y2}P_{1-y2}$ lattice matching with InP, and a second laser structure including an active layer comprising $InGaAs_{y1}P_{1-y1}$, cladding layers comprising InP, and having a refractive index, successively arranged so that forward directions of the first laser structure and the second laser structure are the same as the forward direction of the semiconductor laser, and the forward direction of the tunnel diode structure is reverse to the forward direction of the semiconductor laser, wherein $y2>y1$, $y2>0$, laser light is generated when a current flows in the forward direction of the semiconductor laser, and the $InGaAs_{y1}P_{1-y2}$ tunnel diode structure has a refractive index larger than the refractive indices of the first laser structure and the second laser structure.

* * * * *